United States Patent [19]

Shimizu et al.

[11] Patent Number: 5,085,973
[45] Date of Patent: Feb. 4, 1992

[54] COLORED FILTER ELEMENT CONTAINING LAYERS OF POLYMERIZABLE COMPOSITION

[75] Inventors: Tokihiko Shimizu, Nara; Kesanao Kobayashi, Shizuoka, both of Japan

[73] Assignee: Matsushita Electric Industrial Co., Ltd., Osaka, Japan

[21] Appl. No.: 715,017

[22] Filed: Jun. 13, 1991

Related U.S. Application Data

[62] Division of Ser. No. 374,977, Jul. 3, 1989, abandoned.

[30] Foreign Application Priority Data

Jul. 25, 1988 [JP] Japan .................. 63-184979

[51] Int. Cl.$^5$ .............................................. G03C 1/76
[52] U.S. Cl. ............................ 430/271; 430/273; 430/281; 430/293; 430/321; 430/511; 522/75; 359/891; 359/68
[58] Field of Search ............. 522/75; 430/281, 271, 430/273, 293, 321, 571; 350/317

[56] References Cited

U.S. PATENT DOCUMENTS

| | | | |
|---|---|---|---|
| 3,041,172 | 6/1962 | Evans et al. | 430/281 |
| 3,202,508 | 9/1965 | Heiart | 522/75 |
| 3,615,448 | 10/1971 | Yeshin | 430/281 |
| 4,042,476 | 8/1977 | Collins et al. | 430/281 |
| 4,341,860 | 7/1982 | Sysak | 430/281 |
| 4,477,327 | 10/1984 | Cassatta et al. | 522/75 |
| 4,934,791 | 6/1990 | Shimizu et al. | |

OTHER PUBLICATIONS

"Color Filters from Pigment-Dispersed Photopolymers" Written by T. Shimizu et al., and Disclosed in Journal of Photopolymer Science and Technology, vol. 2, No. 2, (1989), pp. 243-248.

Primary Examiner—Jack P. Brammer
Assistant Examiner—Jack P. Brammer
Attorney, Agent, or Firm—Stevens, Davis, Miller & Mosher

[57] ABSTRACT

Herein is provided a color filter prepared by providing red, green and blue image elements, comprising as photosensitive resin and a pigment, and a black matrix on a transparent substrate and further providing thereon a transparent electrode layer, wherein said photosensitive resin is so formulated that it comprises a polyfunctional acrylate monomer, an organic polymer binder and a photopolymerization initiator comprising a 2-mercapto-5-substituted thiadiazole compound represented by general formulas (I) and/or general formulas (II), a phenyl ketone compound represented by general formulas (III) and 2,4,5-triphenylimidazolyl dimer composed of two lophine residues combined to each other through intermediation of a single covalent bond.

A pattern having a high precision and a good surface smoothness can be obtained owing to the photosensitive resin, and a color filter having a good environmental resistance can be obtained owning to the pigment.

1 Claim, 3 Drawing Sheets

| | |
|---|---|
| 1 ---- TRANSPARENT SUBSTRATE | 4 ---- TFT DRIVING PART |
| 2 ---- COLOR FILTER | 4a ---- TRANSISTER |
| 2a ---- IMAGE ELEMENT | 4b ---- SOURCE LINE |
| 2b ---- BLACK MATRIX | 4c ---- CONFRONTING TRANSPARENT ELECTRODE |
| 2c ---- TRANSPARENT ELECTRODE | |
| 3 ---- ORIENTED PLATE | 4d ---- GATE ELECTRODE |
| 3' ---- ORIENTED PLATE | 5 ---- TN LIQUID CRYSTAL |

1 ---- TRANSPARENT SUBSTRATE
2 ---- COLOR FILTER
2a ---- IMAGE ELEMENT
2b ---- BLACK MATRIX
2c ---- TRANSPARENT ELECTRODE
3 ---- ORIENTED PLATE
3' ---- ORIENTED PLATE
4 ---- TFT DRIVING PART
4a ---- TRANSISTER
4b ---- SOURCE LINE
4c ---- CONFRONTING TRANSPARENT ELECTRODE
4d ---- GATE ELECTRODE
5 ---- TN LIQUID CRYSTAL

— NTSC

● PRODUCT OF THE PRESENT INVENTION

○ PRIOR ART PRODUCT

COLORED FILTER ELEMENT CONTAINING LAYERS OF POLYMERIZABLE COMPOSITION

This application is a division of application Ser. No. 07/374,977, filed July 3, 1989, now abandoned.

BACKGROUND OF THE INVENTION

This invention relates to a color filter suitable for a combined use with liquid crystal or image sensor which can be used in television, video monitor or display and image scanner of computer. In the color liquid crystal display devices of prior art containing a liquid crystal and a color filter as its constitutional elements for controlling transmission or reflection of light, the color filter has been prepared by forming red-, green- and blue-colored image elements and black matrix on a glass substrate by the dyeing process or printing process. Particularly in color liquid crystal display devices requiring an image of high precision, a color filter prepared by dyeing process is mainly used. Color image scanner is also in the same situation as above. However, prior color filters have been disadvantageous in the following point.

Thus, a color filter prepared by dyeing process is prepared by using a natural photosensitive components such as gelatine and the like or a synthetic photosensitive resin such as amine-modified polyvinyl alcohol and the like as a dyeing substrate and dyeing it with a dye such as acid dye and the like. However, this type of color filter is disadvantageous in that it is poor in reliabilities such as light resistance, heat resistance and moisture resistance. On the other hand, prior color filter prepared by printing process were prepared by the use of an ink formed by dispersing a pigment into a thermosetting resin or an ultravioletcurable resin. However, this type of color filter is inferior in the ability to give a pattern of high precision and in surface smoothness. Although an ink prepared by dispersing a pigment into a photosensitive polyimide resin is disclosed in Japanese Patent Application Kokai (Laid-Open) No. 60-237,403, polyimide resin is disadvantageous in that, if its thickness exceeds 1.0 micron, an absorption appears in the visible region and color reproducibility is deteriorated. Particularly when electrical field strength and light path length of cell gap must be varied by changing the thicknesses of red, green and blue image elements for the purpose of improving contrast (hereinafter, this procedure is simply referred to as "multi-gap"), it is difficult to achieve a color reproducibility comparable to that of CRT.

As photopolymerization initiator of photosensitive resins, polycyclic quinone compounds such as anthraquinone, naphthoquinone and the like have hitherto been used. However, there has been a practical problem that they are so low in sensitivity that formation of image element upon irradiation with light takes a long period of time particularly when the photosensitive resin contains a pigment.

Further, if pigment concentration is elevated in order to achieve a good color reproducibility, no sufficient polymer can be obtained by irradiation with light only, so that the resin is not good in adhesive property and cannot form a fine image upon development. Further, there has been a problem in the point of environmental reliability, too. Apart from the above, a product prepared by dispersing a pigment into a natural photosensitive component or photosensitive polyvinyl alcohol resin may also be thought out. However, this type of product is not good in resolving power, sensitivity and dispersion stability. Further, it is poor in heat resistance and moisture resistance.

The next problem is that, if a pigment is dispersed as it is, it cannot be finely dispersed because of coagulation and association and, if it can once be dispersed, the resulting dispersion is not stable because re-agglomeration takes place. Next, in the electrode structure of color filter, if a transparent electrode such as ITO and the like is provided on a transparent substrate made of glass or the like and a color filter is constructed thereon, the insulating layer causes a drop in voltage so that a higher voltage must be applied to the panel in order to achieve the desired liquid crystal panel characteristics. Particularly in case of multi-gap panel, this makes it impossible to apply voltage in accordance with the kind of image element (red, green and blue). Further, when a TFT element composed of amorphous silicon is used, light must be intercepted, and hence the concentration of pigment such as carbon black in the black matrix must be enhanced which brings about a problem that the voltage in the considered area becomes different from that in other image elements.

SUMMARY OF THE INVENTION

It is the object of this invention to provide a color filter which can give a pattern having a high precision and an excellent surface smoothness owing to the photosensitive resin composition used therein and has a good environmental resistance owing to the pigment used therein.

In order to achieve the above-mentioned object, the color filter of this invention is so constructed that red, green and blue image elements and a black matrix includes a photosensitive component and a pigment are provided on a transparent substrate and a transparent electrode layer is provided on the surface, and said photosensitive composition comprises a polyfunctional acrylate monomer, an organic polymer binder and a photopolymerization initiator consisting of at least one member selected from 2-mercapto-5-substituted thiadiazole compounds represented by the following general formulas (I) and/or (II), a phenyl ketone compound represented by the following general formula (III) and 2,4,5-triphenyl-imidazolyl dimer composed of two lophine residues combined to each other through intermediation of a single covalent bond,

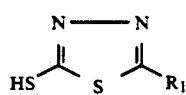   General formula (I)

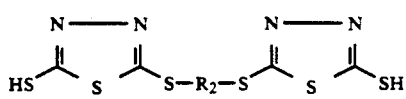   General formula (II)

wherein $R_1$ represents an alkyl group, an alkylthio group or an aralkylthio group; and $R_2$ represents substituted or unsubstituted alkylene group,

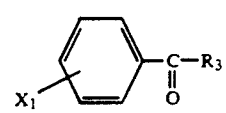   General formula (III)

wherein $X_1$ represents a hydrogen atom, an alkyl group having 1 to 6 carbon atoms, an alkoxycarboxy group having 1 to 6 carbon atoms, an alkoxycarbonyl group having 1 to 6 carbon atoms, an alkyl-disubstituted-amino group having 1 to 6 carbon atoms or a halogen atom, and $R_3$ represents a hydrogen atom or a group of the following general formula (IV),

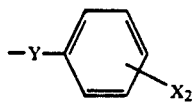

wherein $X_1$ has the same meaning as defined in that of $X_1$; Y represents single bond or a group of the following formula,

wherein $R_4$ represents a hydrogen atom or $OR_5$; and $R_5$ represents a hydrogen atom or an alkyl group having 1 to 6 carbon atoms.

DETAILED DESCRIPTION OF THE INVENTION

Figure 1:
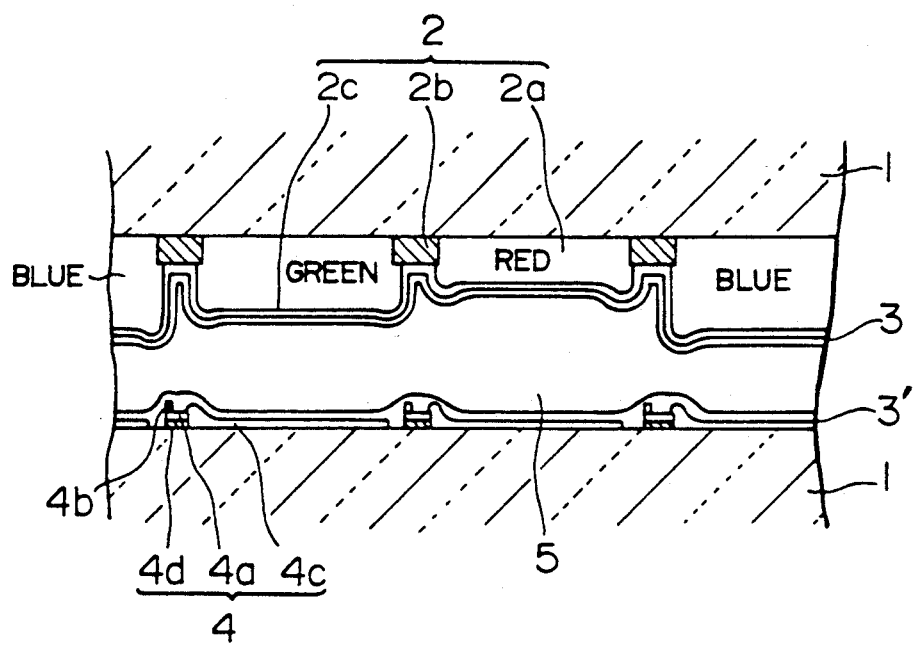
FIG. 1 is a sectional view of the liquid crystal display panel using the color filter of this invention.

FIG. 1 is a sectional view illustrating one example of the panel construction using the color filter of this invention. In this figure, 1,1 are transparent substrates made of glass or plastic such as acrylic resin, and 2 is color filter constituted of red, green and blue image elements 2a includes a photosensitive component and pigment, black-colored black matrix 2b and transparent electrode layer composed of ITO etc. 3,3' are oriented film made of polyimide or the like, 4 is TFT driving part constituted of transistor 4a, source line 4b, confronting transparent electrode 4c and gate electrode 4d. 5 is TN liquid crystal. Further, a polarized light filter is provided on one surface of the transparent substrate not contacted with the liquid crystal. Next, one example of the materials constituting color filter are mentioned below. As the photosensitive composition, a fundamental composition comprising a polyfunctional acrylate or methacrylate monomer which is one of the polymerizable compounds having ethylenically unsaturated bond, an organic polymer binder for giving heat resistance, chemical characteristics such as chemical resistance and mechanical characteristics such as surface hardness, volume contractability and the like, and a composite photopolymerization initiator consisting of a 2-mercapto-5-substituted thiadiazole compound represented by the above-mentioned general formula (I) and/or (II), a phenyl ketone compound represented by general formula (III) and a 2,4,5-triphenylimidazolyl dimer composed of two lophine residues combined to each other through intermediation of a single covalent bond can be used. As said polyfunctional acrylic or methacrylic monomer, the following compounds can be referred to: ethylene glycol diacrylate, triethylene glycol diacrylate, 1,3-butanediol diacrylate, tetramethylene glycol diacrylate, propylene glycol diacrylate, trimethylolpropane triacrylate, trimethylol triacrylate, 1,4-cyclohexanediol diacrylate, pentaerythritol triacrylate, tetraethylene glycol diacrylate, pentaerythritol diacrylate, pentaerythritol tetraacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypropoxy)-phenyl]dimethylmethane, bis[p-(methacryloxyethoxy)-phenyl]dimethylmethane, and the like. Apart from the abovementioned monomers, prepolymers such as dimers and trimers of the monomers are also effectively usable. Further, ester compounds formed between other unsaturated carboxylic acids such as itaconic acid, crotonic acid, isocrotonic acid and maleic acid and an aliphatic polyhydric alcohol are also effectively usable. As said organic polymer binder, copolymers miscible with the acrylate monomers constituted of an unsaturated organic acid compound such as acrylic acid, methacrylic acid and the like and an unsaturated organic acid ester such as methyl acrylate, ethyl methacrylate, benzyl methacrylate and the like can be referred to. If a binder having an acidic group such as carboxyl group is used, aqueous development becomes possible, which is advantageous over organic solvent development in the point of economicity and safety.

As examples of the compound represented by general formula (I) or (II) usable as the photopolymerization initiator, the compounds of the following structural formulas mentioned in Japanese Patent Publication No. 61-172,139 can be referred to:

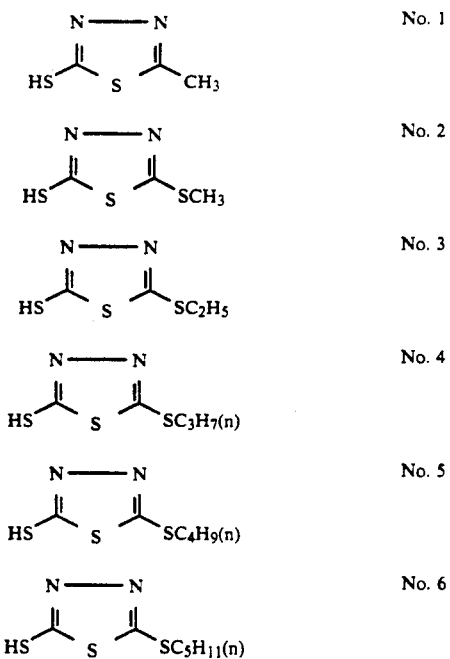

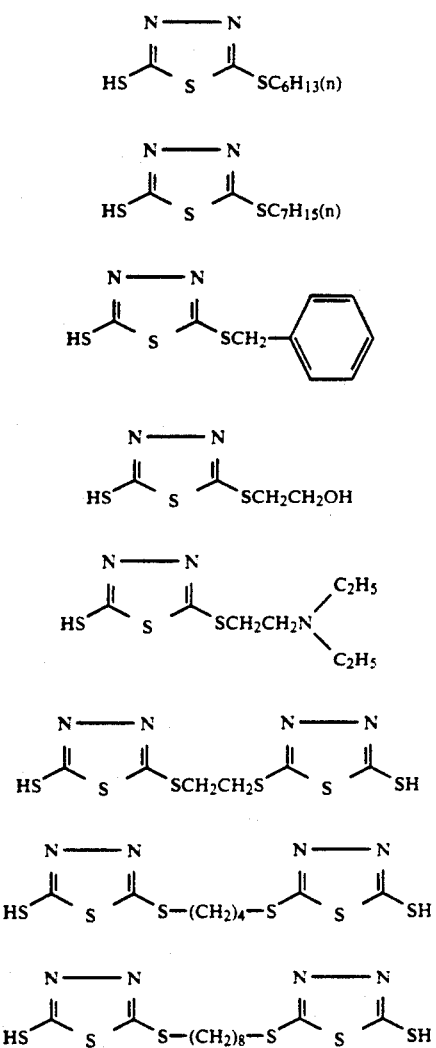

No. 7

No. 8

No. 9

No. 10

No. 11

No. 12

No. 13

No. 14

As concrete examples of the compound of general formula (III), benzophenone, 4-chlorobenzophenone, 2,4-dichlorobenzophenone, 2-ethoxycarbonylbenzophenone, benzophenone-2-carboxylic acid, 4-methylbenzophenone, 4,4-dimethoxybenzophenone, 4,4-bis(-dimethylamino)benzophenone, 4,4-bis(diethylamino)-benzophenone, 4-dimethylaminobenzophenone, 4-dimethylaminobenzoacetophenone, benzoin, benzoin methyl ether, benzoin ethyl ether, benzoin isopropyl ether, benzoin propyl ether, benzoin phenyl ether, benzil dimethyl ketal, 3,3-dimethoxybenzoin, and the like can be referred to.

Next, the fundamental structure of the 2,4,5-triphenylimidazolyl dimer composed of two lophine residues combined to each other through intermediation of a single covalent bond can be expressed by the following structural formula:

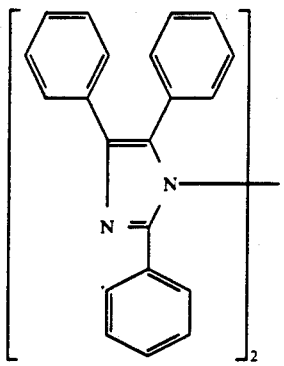

Concrete examples of the 2,4,5-triphenylimidazolyl dimer include 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, and the like. In the photopolymerizable composition of this invention, the photopolymerization velocity is enhanced by a combined use of plural free radical formers, i.e. photopolymerization initiators, represented by the general formulas of this invention.

As the red-colored pigment, anthraquinone pigment or perylene pigment is used either alone or in the form of a mixture consisting of their at least one member and disazo type yellow pigment or isoindoline type yellow pigment. As example of said anthraquinone pigment, C. I. Pigment Red 177 can be referred to. As example of said perylene pigment, C. I. Pigment Red 155 can be referred to. From the viewpoint of color reproducibility, their mixtures with C. I. Pigment Yellow 83 and with C. I. Pigment Yellow 139 are desirable. The ratio (by weight) of red-colored pigment to yellow-colored pigment is preferably in the range of 100:5 to 100:50. If this ratio is smaller than 100:4, the light transmission in the region of 400–500 nm cannot be suppressed, so that a high color purity cannot be achieved. If the ratio is greater than 100:51, the main wavelength shifts to the shorter wavelength side and deviation of the hue from the objective NTSC hue becomes great. Particularly preferable range of this ratio is 100:10 to 100:40.

As the green-colored pigment, halogenated phthalocyanine pigment is used either alone or in the form of its mixture with disazo type yellow pigment or isoindoline type yellow pigment. For example, mixture of C. I. Pigment Green 7, 36 or 37 and C. I. Pigment Yellow 83 or C. I. Pigment Yellow 139 gives a good result. The ratio (by weight) of green pigment to yellow pigment is preferably in the range of 100:5 to 100:40. If this ratio is smaller than 100:4, the light transmission in the region of 400 to 450 nm cannot be suppressed, and a high color purity cannot be achieved. If this ratio is greater than 100:41, the main wavelength shifts to the longer wavelength side, and deviation of hue from the objective NTSC hue becomes great. Particularly preferable range of this ratio is 100:5 to 100:20. As the blue-colored pigment, phthalocyanine pigment is used either alone or in the form of a mixture with a dioxazine type violet pigment. For example, mixture of C. I. Pigment Blue 15:3 and C. I. Pigment Violet 23 gives a good result. Ratio (by weight) of blue pigment to violet pigment is preferably in the range of 100:5 to 100:50. If this ratio is smaller than 100:4, the light transmission in the region of 400 to 420 nm cannot be suppressed, and a high color purity cannot be achieved. If the ratio is greater than 100:51, the main wavelength shifts to the longer wavelength side and the deviation of the hue from the objective NTSC hue becomes great. The most preferable range of this ratio is 100:5 to 100:20.

Further, by using a powdery processed pigment prepared by finely dispersing the above-mentioned pigments into one member selected from the group consisting of acrylic resin, maleic acid resin, vinyl chloride-vinyl acetate copolymer resin and ethyl cellulose resin, a pigment-containing photosensitive composition excellent in dispersibility and dispersion stability can be obtained. Particularly, processed pigments using acrylic resin and ethy cellulose resin are most desirable from the viewpoint of transparency and dispersion stability.

As the pigment for the matrix, carbon, titanium oxide and iron oxide are used either alone or in mixture. Among them, carbon and titanium-carbon give a good result. The ratio (by weight) is preferably in the range of 100:5 to 100:40. If this ratio is smaller than 100:4, light transmission in the longer wavelength region is great. If this ratio is greater than 100:41, dispersion stability is not good.

Next, concentration of pigment in the total solid component consisting of various pigments and resin is preferably in the range of 10 to 45% by weight. If this concentration is lower than 9.5% by weight, a high color purity can be achieved only when the film thickness is 10 microns or above, which is disadvantageous from the practical point of view. If the concentration is higher than 46% by weight, dispersion stability is not good. The most desirable concentration range is 20% by weight to 40% by weight.

Further, a better result is obtained with regard to light transmission when the pigment particle system has a mean particle diameter smaller than the wavelength of visible region (400 to 700 nm), and preferably has a particle diameter 1/2 time as long as the wavelength of visible region.

Next, examples of this invention will be detailed below.

EXAMPLE 1

As transparent substrate, a glass plate washed with neutral detergent, water, isopropyl alcohol and flon was used. As photosensitive component, a resin composition having the following formulation was used:

Benzyl methacrylate-methacrylic acid copolymer (molar ratio 73/23): 30 g
Pentaerythritol tetraacrylate: 7.35 g
2-Mercapto-5-methylthio-1,3,4-thiadiazole: 0.1 g
Michler's ketone: 0.04 g
2-(2-Chlorophenyl)-4,5-diphenylimidazolyl dimer: 0.4 g
Hydroquinone monomethyl ether: 0.01 g
Ethyl cellosolve acetate: 62 g As red coloring material, a finely dispersed mixture of C. I. Pigment Red 177 and C. I. Pigment Yellow 139 (net pigment weight ratio 100:35) was used. As green coloring material, a mixture (100:15) of C. I. Pigment Green 36 and C. I. Pigment Yellow 83 was used. As blue coloring material, a mixture (100:5) of C. I. Pigment Blue 15:3 and C. I. Pigment Violet 23 was used. As black pigment, a mixture (100:30) of carbon and titanium oxide was used. Each of the pigments was kneaded and dispersed together with the above-mentioned photosensitive component by means of triple roll mill or the like to prepare a pasty material. Then, ethyl cellosolve acetate was added to each paste and the resulting mixture was dispersed by means of ball mill to prepare a solution. Formulations of the solutions thus obtained were as shown in Table 1 in terms of ratio by weight.

TABLE 1

|  | Resin | Pigment | Solvent |
|---|---|---|---|
| Red | 13 | 7 | 80 |
| Green | 13 | 7 | 80 |
| Blue | 14 | 6 | 80 |
| Black | 15 | 5 | 80 |

Particle sizes of the pigment systems used herein were adjusted to 0.7 micron or below. Particularly, red, green and blue pigments were dispersed so that their particle sizes reached 0.5 micron, 0.3 micron and 0.2 micron, respectively.

Next, conditions of coating and exposure were as shown in Table 2.

TABLE 2

|  | Spin rotation number | Exposure condition |
|---|---|---|
| Red | 1,800 RPM | 20 mJ/cm$^2$ |
| Green | 1,500 | 20 |
| Blue | 1,000 | 25 |
| Black | 700 | 30 |

Prebaking was carried out at a temperature of 80° C. for a period of 15 minutes; and development was carried out with 1% (by weight) aqueous solution of sodium carbonate. The colors were coated in the following order: black of black matrix, followed by red of image element, followed by green of image element, and further followed by blue of element. Thicknesses of the coatings were as shown in Table 3.

TABLE 3

|  | Thickness of image element | Thickness of black matrix |
|---|---|---|
| Red | 1.0 μm |  |
| Green | 1.5 |  |
| Blue | 2.0 |  |
|  |  | 0.8 μm |

Figure 2:
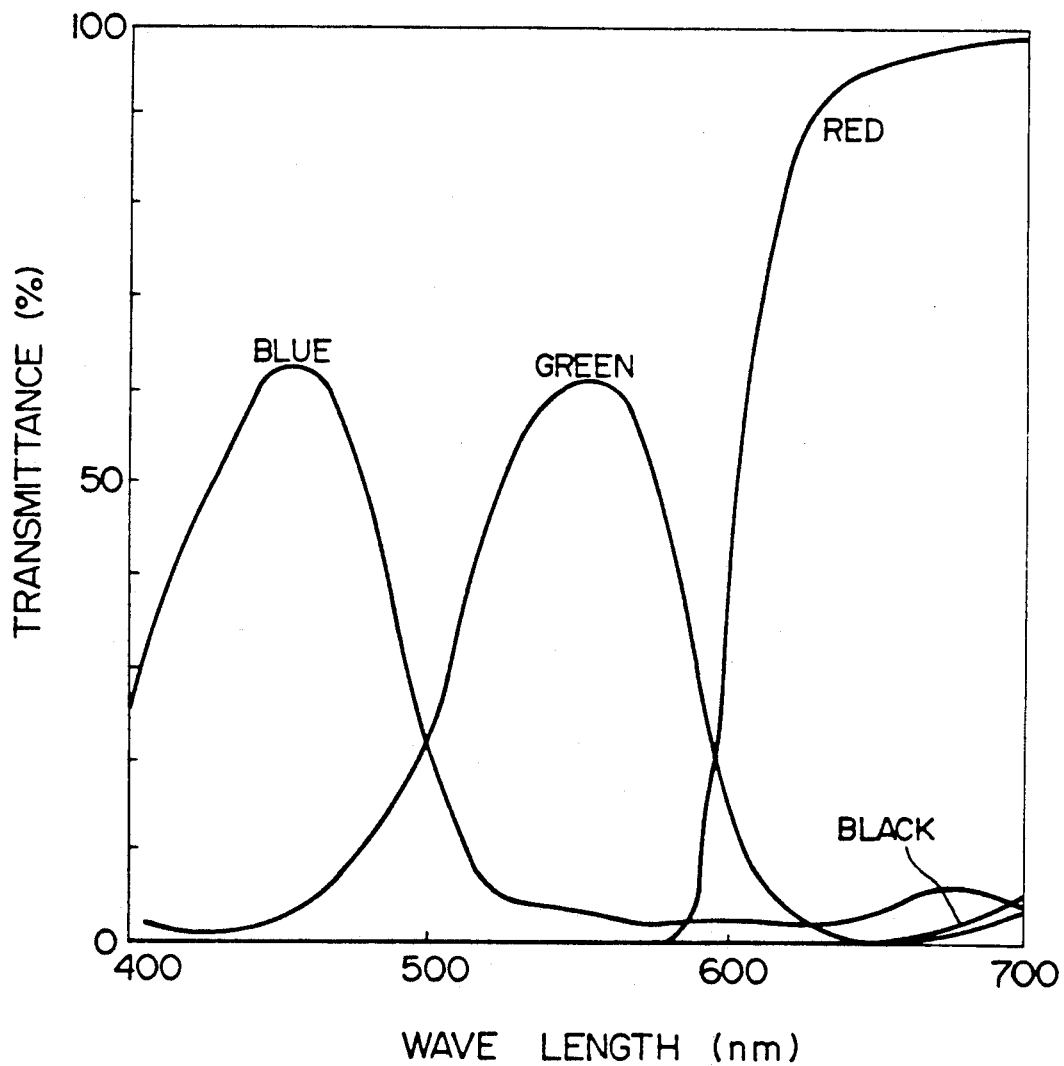
FIG. 2 is a spectral chart of the color filter of one example of this invention.

FIG. 2 illustrates the spectral characteristics of the color filter prepared in the abovementioned manner.

COMPARATIVE EXAMPLE 1

Onto a glass substrate which had been treated in the same manner as in Example 1, a photosensitive dyeing substrate consisting of 15 parts by weight of a low molecular weight gelatine (average molecular weight 10,000), 2 parts by weight of ammonium bichromate, 0.5 part by weight of chroium alum and 82.5 parts by weight of water was applied. Then it was dyed with the following dyes: red 24P (manufactured by Nippon Kayaku K. K.), green 1P, blue 5C, black C. I. 110. Conditions of the dyeing were as shown in Table 4.

TABLE 4

| | Coating condition (RPM) | Exposure condition (mJ/cm$^2$) | Dyeing condition |
|---|---|---|---|
| Red | 3,000 | 100 | 60° C. (pH 4) |
| Green | 2,500 | 120 | 60° C. (pH 4.5) |
| Blue | 2,000 | 120 | 50° C. (pH 6) |
| Black | 1,000 | 150 | 80° C. (pH 3) |

Prebaking was carried out at 60° C. for 5 minutes. A color filter was prepared by making coatings in order of red (image element), followed by green, followed by blue, and followed by black matrix. Thicknesses of the coatings were as follows: red 1.0 μm, green 1.5 μm, blue 2.0 μm, black matrix 2.5 μm.

The color filters of Example 1 and Comparative Example 1 were subjected to light resistance test for 1,000 hours by means of xenon fade-o-meter (FAL-25AXHC, manufactured by Suga Shikenki K. K.). Further, they were subjected to a heat resistance test at 170° C. for 10 hours, and the results were expressed in term of ΔE by Lab. Results of these tests are summarized in Table 5.

TABLE 5

| | Light resistance | | | Heat resistance | | |
|---|---|---|---|---|---|---|
| | R | G | B | R | G | B |
| Example 1 | 1.7 | 1.0 | 1.2 | 0.3 | 0.1 | 0.2 |
| Comparative Example 1 | 5.8 | 7.3 | 5.2 | 2.1 | 3.4 | 5.9 |

COMPARATIVE EXAMPLE 2

A color filter was prepared by the use of a photosensitive polyimide resin (Photoness, manufactured by Torey K. K.). Formulation of pigments was the same as in Example 1. As the solvent, N-methylpyrrolidone was used. Exposure was carried out with a high pressure mercury lamp in the range of 400 mJ/cm to 600 mJ/cm. Development was carried out with an exclusive developer (DV-140).

Figure 3:
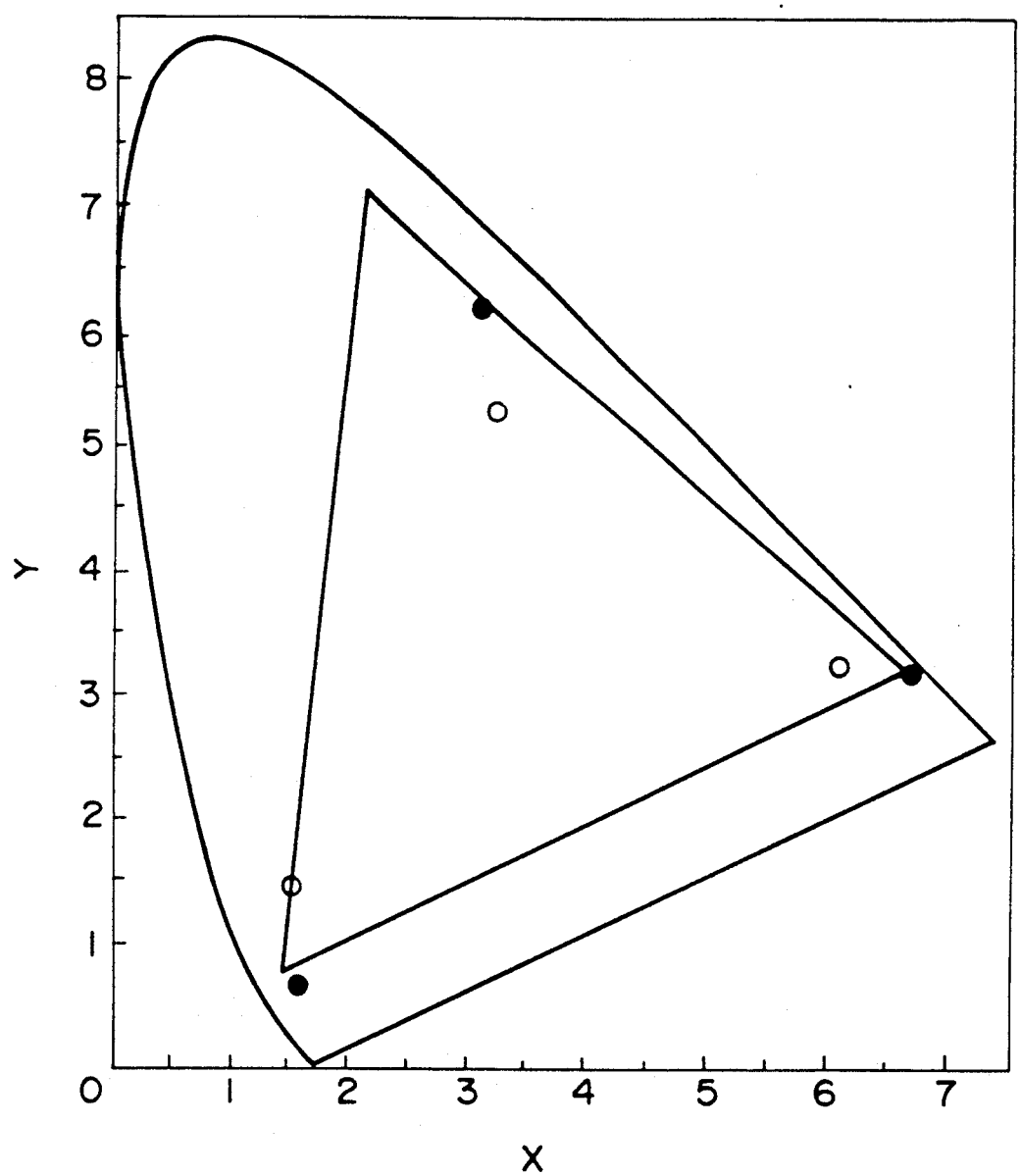
FIG. 3 is a chromaticity chart thereof: wherein 1 is transparent substrate, 2 is color filter, 3 is oriented film, 4 is TFT driving part, and 5 is TN liquid crystal.

In FIG. 3, the chromaticity charts of the color filters of Example 1 and Comparative Example 2 are compared with the chromaticity points of NTSC.

It is apparent from the description presented above that the product of this invention is evidently superior to prior products in reliabilities such as color reproducibility, light resistance and heat resistance.

When material formulation was varied in the scope of this invention, the results obtained therefrom were similar to the above.

We claim:

1. A color filter prepared by providing red, green and blue image elements, comprising a photosensitive resin and a pigment, and a black matrix on a transparent substrate and further providing a transparent electrode layer either on the image elements thus formed or on said transparent substrate, said photosensitive resin comprising a polyfunctional acrylate monomer, an organic polymer binder and a photopolymerization initiator, said photopolymerization initiator consisting of at least one member selected from the 2-mercapto-5-substituted thiadiazole compounds represented by the following general formula (I) and/or general formula (II), a phenyl ketone compound represented by the following general formula (III), and a 2,4,5-triphenylimidazolyl dimer composed of two lophine residues combined to each other through intermediation of a single covalent bond:

  (I)

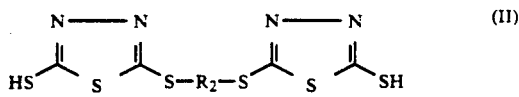  (II)

wherein $R_1$ represents alkyl group, alkylthio group or aralkylthio group, and $R_2$ represents substituted or unsubstituted alkylene group;

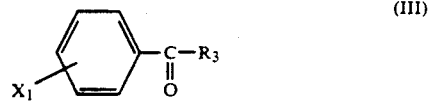  (III)

wherein $X_1$, identical or different, represents hydrogen atom, alkyl group having 1 to 6 carbon atoms, alkoxycarboxy group having 1 to 6 carbon atoms, alkoxycarbonyl group having 1 to 6 carbon atoms, alkyl-disubstituted-amino group having 1 to 6 carbon atoms or halogen atom, and $R_3$ represents hydrogen atom or a group represented by the following general formula (IV):

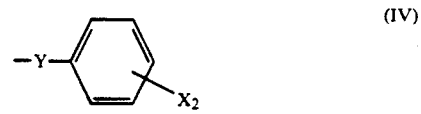  (IV)

wherein Y represents single bond or a group of the following formula

wherein $R_4$ represents hydrogen atom or $OR_5$, and $R_5$ represents hydrogen atom or alkyl group having 1 to 6 carbon atoms.

* * * * *